United States Patent [19]
van Baardewijk et al.

[11] Patent Number: 4,606,057
[45] Date of Patent: Aug. 12, 1986

[54] ARRANGEMENT FOR CHECKING THE COUNTING FUNCTION OF COUNTERS

[75] Inventors: Johannes van Baardewijk; Johan E. A. Hartman; Nicolaas Bohlmeyer, all of Hilversum, Netherlands

[73] Assignee: U.S. Philips Corporation, New York, N.Y.

[21] Appl. No.: 632,497

[22] Filed: Jul. 19, 1984

[30] Foreign Application Priority Data

Aug. 1, 1983 [NL] Netherlands .................. 8302722

[51] Int. Cl.⁴ ............................................. H03K 21/40
[52] U.S. Cl. ....................................... 377/28; 377/56; 371/67
[58] Field of Search .................. 377/28, 56; 371/49, 371/50, 67

[56] References Cited

U.S. PATENT DOCUMENTS

| | | | |
|---|---|---|---|
| 3,113,204 | 12/1963 | O'Brien | 377/28 |
| 3,117,219 | 1/1964 | Merfeld | 377/28 |
| 3,526,758 | 9/1970 | Nozawa | 377/28 |
| 3,668,431 | 6/1972 | Locke | 377/28 |
| 3,911,261 | 10/1975 | Taylor | 377/28 |
| 4,107,649 | 8/1978 | Kurihara | 371/49 |
| 4,130,818 | 12/1978 | Snyder | 371/49 |

Primary Examiner—John S. Heyman
Attorney, Agent, or Firm—Jack E. Haken; James J. Cannon, Jr.

[57] ABSTRACT

The isochronism of binary counters can be checked by comparing the counting positions. If in a system two counters are required which are operated isochronously but not in synchronism, for example the individual read and write counters for memory addressing purposes, the arrangement according to the invention provides a simple solution by using one counter as a duplicate of the other one instead of duplicating both counters. The parity of the counting position after each increment of both counters is generated. The parity bit of the counter having the highest counting position is delayed by means of a shift register over a number of positions corresponding to the difference in counting positions between the two counters and is then compared with the parity of the counting position of the other counter.

1 Claim, 1 Drawing Figure

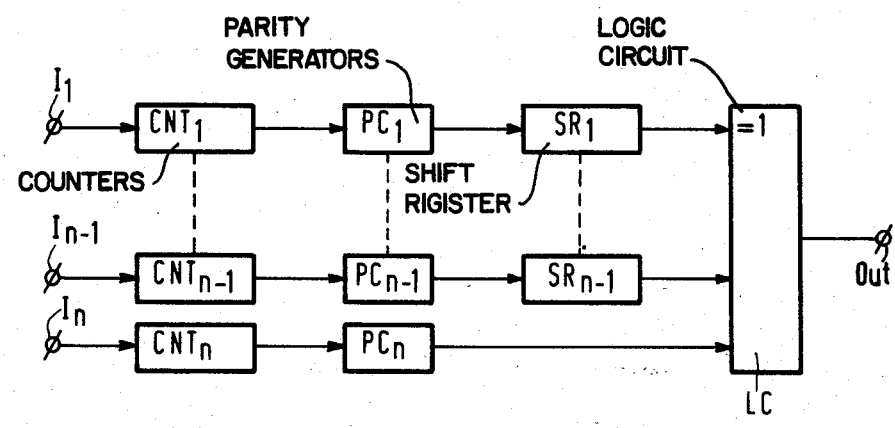

ARRANGEMENT FOR CHECKING THE COUNTING FUNCTION OF COUNTERS

BACKGROUND OF THE INVENTION

The invention relates to an arrangement for checking the counting function of a number ($n \geq 2$), of counters which are operated isochronously.

In order to check a binary counter for proper operation it is known to duplicate the counter and to apply the pulses to be counted to both counters. After each counting pulse either the counting positions or the parities generated across the counter positions are compared with each other. When it is found that counter positions are not identical or have unequal parities, an alarm signal is generated. This alarm signal is an indication that a defect has occurred in one of the two counters or in one of the two parity generators.

If a system requires a plurality of counters which are not operated synchronously but isochronously, all these counters should be duplicated if the above-described way of checking the proper operation is opted for. This implies a significant extension of the system.

SUMMARY OF THE INVENTION

It is an object of the invention to provide an arrangement with which the counting functions of a plurality of isochronous counters are checked in a simple way. To accomplish this the arrangement according to the invention set forth in the opening paragraph, is characterized in that a parity generator for generating the parity of the instantaneous counting position is connected to each counter, that each of the $(n-1)$ parity generators connected to the counters having the highest counter position is connected to a shift register for shifting the parity of the relevant parity generator by a number of positions corresponding to the difference between the counting positions of the relevant counter and the counter having the lowest counting position, that an output of each of the $(n-1)$ shift registers and an output of the parity generator connected to the counter having the lowest counting position are connected to a logic circuit, that a first signal is supplied from the output of the logic circuit if the same parity is presented to all inputs, while a second signal is supplied when this is not the case.

The invention is based on the recognition of the fact that when the arrangement includes more than one counter it is possible to check the counters already present in the arrangement against each other and consequently it is not necessary to duplicate each counter.

Further particulars of the arrangement according to the invention will be described by way of example with reference to the embodiment shown in the sole FIGURE of the accompanying drawing.

DESCRIPTION OF THE PREFERRED EMBODIMENT

The FIGURE shows a number of binary counters $CNT_i$ ($i=1, 2, \ldots, n-1, n \geq 2$) each having an input $I_1$ for receiving counting pulses. A parity generator $PC_i$ is connected to an output of each counter and generates the parity of the counting position of the counter to which it is connected. The counters are operated isochronously which means that repeatedly and simultaneously counting pulses are applied to all counters but that the counting positions of the counters may mutually be unequal. The mutual difference in counting positions is however constant. Since the counting positions of the counters $CNT_i$ are unequal the parities generated therefrom will generally also be unequal.

The parity bits of the $(n-1)$ counters having the highest counting positions are applied to a shift register $SR_i$ ($i=1, 2, \ldots, n-1$) which to that end is connected to an output of the relevant parity generator. (In the figure it is assumed that the counters $CNT_1$ to $CNT_{n-1}$, inclusive have the highest counting positions). The shift register $SR_i$ delays (or shifts) the parity bits applied to it over the number of positions corresponding to the difference between the counting position of the relevant counter ($CNT_i$) and the counting position of the counter having the lowest counting position ($CNT_n$). If the instantaneous counting position of counter $CNT_1$ is, for example, 137, the counting position of counter $CNT_{n-1}$ is 87 and that of counter $CNT_n$ is 18, then shift register $SR_1$ must have 119 shift positions and shift register $SR_{n-1}$ must have 69 shift positions. The output signals of the shift registers $SR_1$ to $SR_{n-1}$, inclusive are now in synchronism with the output signal of counter $CNT_n$. These signals are applied to an co-incidence circuit LC for example an exclusive-OR circuit in the case where only two counters are present. A first signal is supplied from an output OUT of the co-incidence circuit LC when all input signals are equal and a second signal when the input signals are not all equal. In the said first case this means that all the parity bits applied are equal (all "1" or all "0") and from this it may be concluded, at least be assumed with a high degree of probability, that the counting positions to which the parity bits relate are isochronous. In the case in which a second signal is supplied from output OUT not all the parity bits were equal to each other and the isochronism is obviously disturbed.

An arrangement for checking the counting function of isochronous counters is more specifically used in cases in which two counters ($n=2$) are used, such as for example checking individual write and read counters for memory addressing purposes.

What is claimed is:

1. A logical subsystem for checking the counting function of a number of counters n, where ($n \geq 2$), which counters are operated isochronously, comprising:

a number n of counters, where $n \geq 2$;
   a number n of parity generators, where $n \geq 2$;
   each of said parity generators being connected to one of said counters and each of said counters being connected to one of said parity generators;
   each of said parity generators having means for generating the parity of the instantaneous counting position of the counter to which it is connected;
   $(n-1)$ of said parity generators being connected to counters having the highest counting positions;
   $(n-1)$ shift registers being connected to said $n-1$ parity generators, such that each of said shift registers shifts the parity of the parity generator to which it is connected by a number of positions corresponding to the difference between the counting position of the counter to which it is connected and the counting position of the counter having the lowest counting position;
   the output of each of said $(n-1)$ shift registers, and the output of the parity generator connected to said counter having the lowest counting position being connected to a logic circuit such that said logic circuit outputs a first signal if the same parity is presented to all its inputs, and outputs a second signal if the parity presented to one input differs from the parity presented to at least one other input.

* * * * *